United States Patent [19]

Milnes

[11] 4,158,577

[45] Jun. 19, 1979

[54] HIGH OUTPUT SOLAR CELLS

[76] Inventor: Arthur G. Milnes, c/o Carnegie-Mellon University, Schenley Park, Pittsburgh, Pa. 15213

[21] Appl. No.: 922,068

[22] Filed: Jul. 5, 1978

[51] Int. Cl.$^2$ ............................................. H01L 31/06
[52] U.S. Cl. ............................ 136/89 SJ; 136/89 SG; 357/30
[58] Field of Search .................. 136/89 SJ, 89 SG; 357/30

[56] References Cited

U.S. PATENT DOCUMENTS

| 3,990,101 | 11/1976 | Ettenberg et al. | 357/30 |
| 3,995,303 | 11/1976 | Nahory et al. | 357/30 |
| 4,122,476 | 10/1978 | Hovel et al. | 357/16 |

OTHER PUBLICATIONS

S. C. Tsaur et al., "Theoretical & Experimental Results for GaAs Solar Cells," *4th Int'l. Symposium on GaAs*, Boulder, Colorado, (1972).
J. S. Escher et al., "Bias-Assisted Photoemission in the 1-2 Micron Range," *Technical Digest*, 1977 *Int'l. Electron Devices Meeting*, Wash., D.C., (1977).
H. Hovel et al., "Photographic Light Meter & Self-Powered Exposure Controller," *IBM Tech. Disc. Bull.*, vol. 15, p. 3443, (1973).
M. Konagai et al., "Graded-Band-Gap p-Ga$_{1-x}$Al$_x$-As-nGaAs Heterojunction Solar Cells," *J. Appl. Phys.*, vol. 46, pp. 3542-3546, (1975).

*Primary Examiner*—Aaron Weisstuch
*Attorney, Agent, or Firm*—Buell, Blenko & Ziesenheim

[57] ABSTRACT

A high output solar cell comprises a three-layer semiconductor compound article, the layers being doped in pn$_1$n$_2$ order in the direction of light travel, the pn$_1$ junction being a homojunction and the n$_1$n$_2$ junction being a heterojunction. The doping of the layers is such that "valley-tranferred" or "hot" electrons, so-called, are created in th p and n region secondary electron conduction bands and are transferred to the normal conduction band edge of the n$_2$ heterojunction material and ultimately to an ohmic contact.

19 Claims, 16 Drawing Figures

(p Al Ga As WINDOW
PRESENT BUT NOT
SHOWN)

(In,Ga)(As,P) QUATERNARY (Al,Ga)(As,Sb) QUATERNARY

HIGH OUTPUT SOLAR CELLS

My invention to high output solar cells having multiple layers of semiconductor compounds. It is more particularly concerned with such solar cells made from III-V compound semiconductors and their II-V-V2 analogs. Related inventions are found in Milnes and Feucht U.S. Pat. No. 3,993,533, "Method for Making Semiconductors for Solar Cells," Milnes and Feucht application Ser. No. 741,012, "Method for Making Thin Film III-V Compound Semiconductors for Solar Cells," filed Nov. 11, 1976 and my application Ser. No. 795,811, "Dual Electrically Insulated Solar Cells," filed May 11, 1977, now U.S. Pat. No. 4,094,704.

The need for highly efficient solar cells and the technology of GaAs and InP solar cells has been described in the book, *Solar Cells*, Volume 11 Semiconductors and Semimetals, H. J. Hovel, Academic Press 1975. On page 91 of this book the open-circuit voltages of GaAs solar cells are stated to be from 0.90 to 0.94V with fill factors of 0.77 to 0.81. For pGa$_{1-x}$Al$_x$As/pGaAs/nGaAs devices the heteroface window through which the illumination is applied raises the voltage to 0.94-1.0V. More power can be obtained from a solar cell by concentrating the sun's energy. This is described in the paper. "GaAs Concentrator Solar Cells," James and Moon, Conference Record of the Eleventh IEEE Photovoltaic Specialists Conference, p. 402. Further information exists in the paper, "Progress Report on a 1 kW Terrestrial Array of AlGaAs/GaAs Concentrator Solar Cells," James, et al., Conference Record of the Twelfth IEEE Photovoltaic Specialists Conference, p. 771.

It is the principal object of my invention to provide solar cells of the types above mentioned which have higher output voltages than those presently known. Other objects of my invention will appear in the course of the description thereof which follows.

My invention comprises an essentially three-layer semiconductor compound solar cell, the layers being doped in pn$_1$n$_2$ order in the direction of light travel, the pn$_1$ junction being a homojunction and the n$_1$n$_2$ junction being a heterojunction. The doping of the layers is such that "valley transferred" or "hot" electrons, so called, are created in the p and n region secondary electron conduction bands and are transferred to the normal conduction band edge of the n$_2$ heterojunction material, and ultimately to an ohmic contact. The physics of the electron transfer process between conduction band minima valleys caused by an electric field in nGaAs is described in the book by Sze, *Physics of Semiconductor Devices*, p. 745. I prefer to cover my p layer with a semiconductor compound which acts as a window to photons, provides a good ohmic contact, and reduces surface recombination of the next layer. Window technology of this type is described in the Hovel book previously mentioned. I may also introduce an n$_3$+ layer between the n$_2$ layer and substrate for ohmic contact purposes.

Embodiments of my invention presently preferred by me are illustrated and best explained in connection with the attached figures, to which reference is now made.

FIG. 3a is a plot of the direct to indirect energy gap transition in Al$_x$Ga$_{1-x}$As.

FIG. 3b is a plot showing the discontinuity in conduction band E$_c$ of Al$_x$Ga$_{1-x}$As—GaAs heterojunction versus energy gap of the Al$_x$Ga$_{1-x}$As.

In the photocells of my invention the p layer compound is used to populate a secondary higher bandgap energy electron conduction band of the n$_1$ layer, and those electrons are extracted into the n$_2$ heterojunction layer. The output voltage of my photocell is from 0.1 to 0.3 volts higher than that from a conventional cell and this increment is related to the difference between the direct bandgap of the n$_1$ layer compound and its indirect bandgap. The diversion of electrons into the secondary electron conduction band (so-called "transferred or hot" electrons) is accomplished by adjusting the doping of the layers so as to create a high built-in field, on the order of 10$^4$ V/cm or greater, at the pn$_1$ junction. The dopings needed to create fields in excess of 10$^4$ V/cm in pnGaAs junctions are described in the paper by Tsaur, Milnes, Sahai and Feucht, Theoretical and Experimental Results for GaAs Solar Cells, 1972 *Symposium on GaAs*, p. 156, The Institute of Physics, London. (In Gunn GaAs devices fields of even less than 10$^4$ V/cm are known to result in transfer of electrons to X or L electron minima). The extraction of those electrons by the n$_2$ layer is accomplished by matching the bandgap energy of the n$_2$ layer to the bandgap energy of the secondary electron conduction band of the n$_1$ layer.

Figure 1:
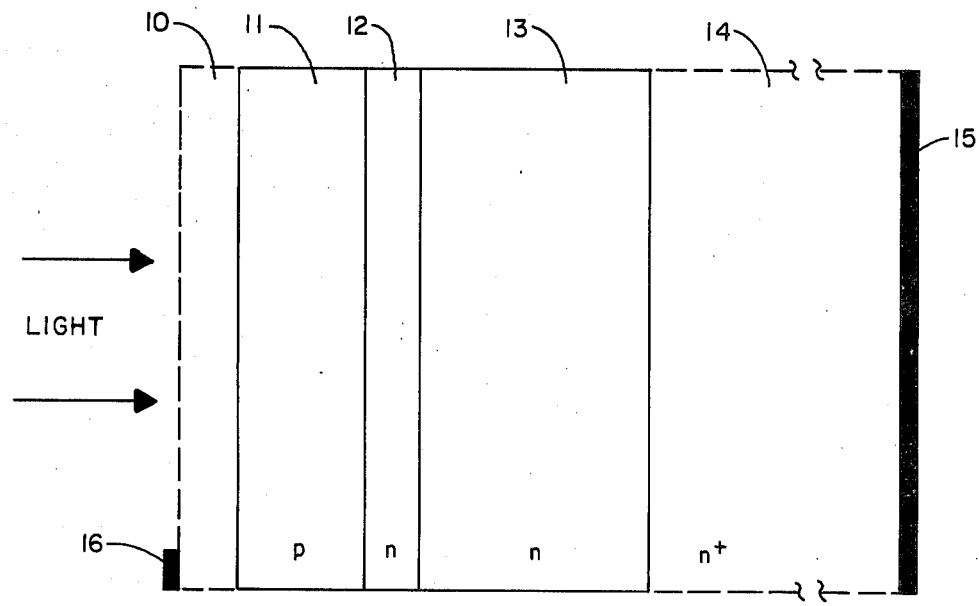
FIG. 1 is a schematic showing the arrangement of the various layers in my solar cell.

In a presently preferred embodiment of my invention, layer 11 of FIG. 1 is a pGaAs layer about 2 to 4 μm thick doped ~ 10$^{18}$ cm$^{-3}$ with L$_n$>4 μm. Its direct bandgap is 1.45 eV in its primary electron conduction band, and it has a bandgap of about 1.81 eV at its nearest adjacent higher secondary electron conduction band. Layer 12 is an nGaAs layer about 0.02 to 1 μm thick, doped ~ 5×10$^{17}$ cm$^{-3}$ with L$_p$>2 μm. The doping in the p and n layers is adjusted to create a high field at the junction with a relatively narrow depletion region, so that the fraction of electrons diverted into the higher bandgap energy secondary electron conduction band is relatively large.

Figure 3:
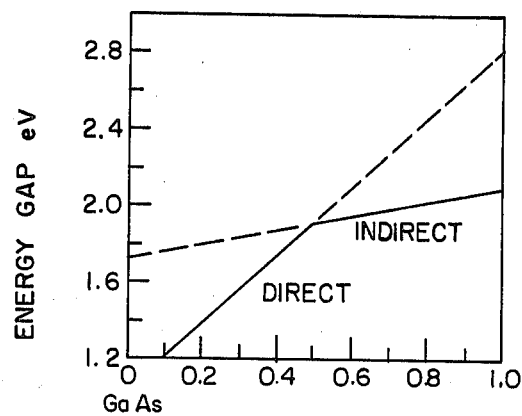
Figure 3:
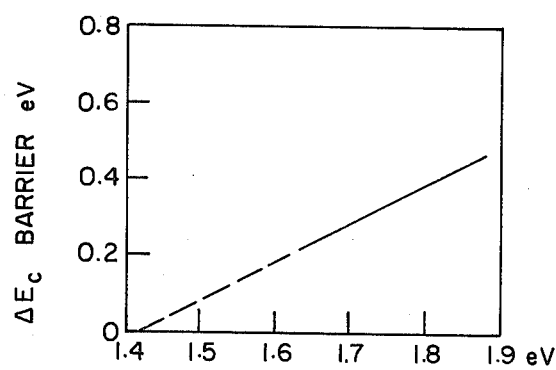

Layer 13 is n type $Al_xGa_{1-x}As$ where x is between 0.1 and 0.5 and is preferably about 0.3. Layer thickness is not critical, preferably between 1 and 5 μm, and the compound is doped mid-$10^{16}$ cm$^{-3}$. The direct bandgap of $Al_{0.3}Ga_{0.7}As$, from FIG. 3, is about 1.75 eV and the indirect energy gap is only slightly higher. Thus, its conduction bands are reasonably well aligned in energy with the secondary electron conduction band of layer 12. Thus, "hot" electrons in the secondary electron conduction band of layer 12 pass into the layer 13 and there thermalize to the direct bandgap.

Layer 10 is a photon window previously mentioned. Preferably it is p+$Al_{0.8}Ga_{0.2}As$ about 500 Å thick. An ohmic contact 16 is affixed to layer 10. Layer 14 is the substrate. It may be n+GaAs, to act as substrate for an epitaxial layer of $Al_{0.3}Ga_{0.7}As$ or it may be other lower cost material such as n+Ge. Layer 15 is an ohmic contact layer.

Figure 2:
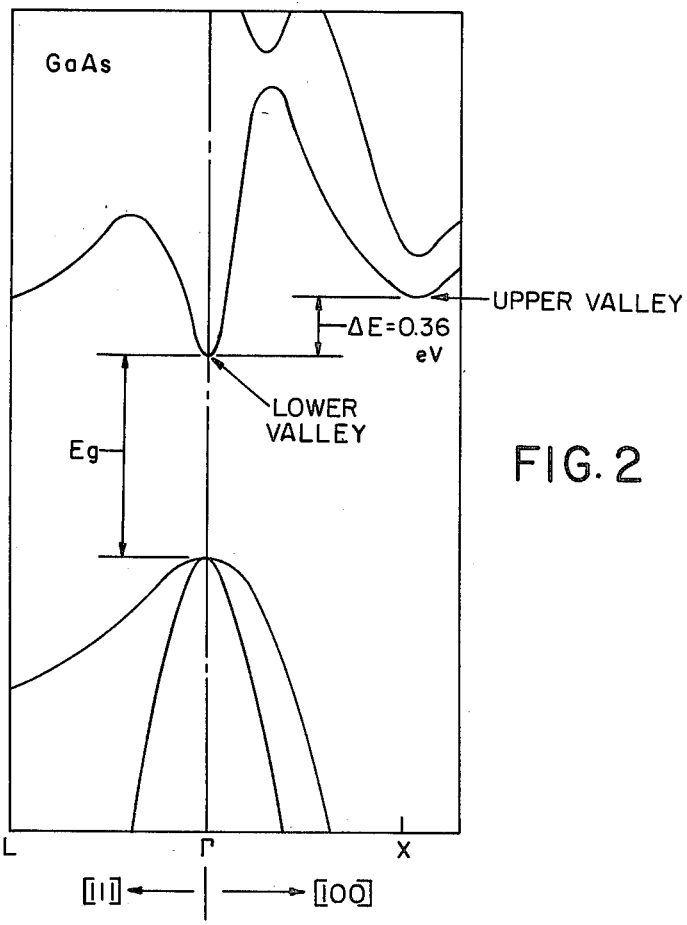
FIG. 2 is the energy band diagram of GaAs.
Figure 4:
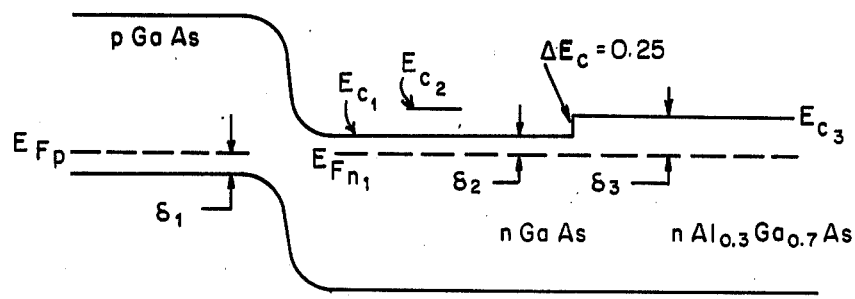
FIG. 4a is an energy band diagram of the structure of FIG. 1 in the absence of illumination.
FIG. 4b is the energy band diagram of FIG. 1 in the presence of illumination, showing the electron flow.
FIG. 4c is the energy band diagram of FIG. 1 in the presence of illumination, showing the output voltage enhancement effect.
Figure 4:
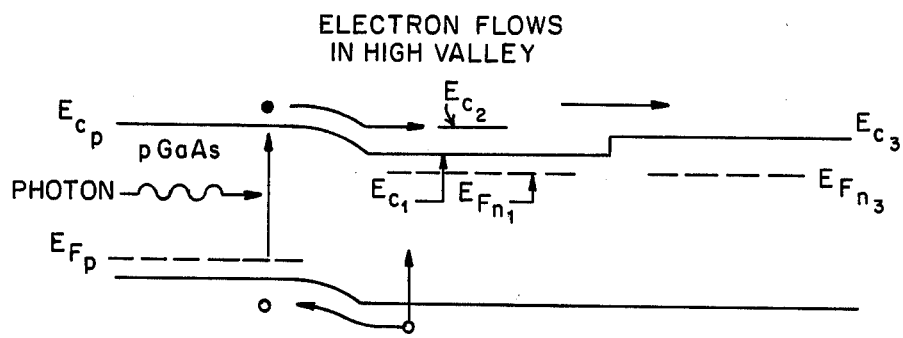
Figure 4:
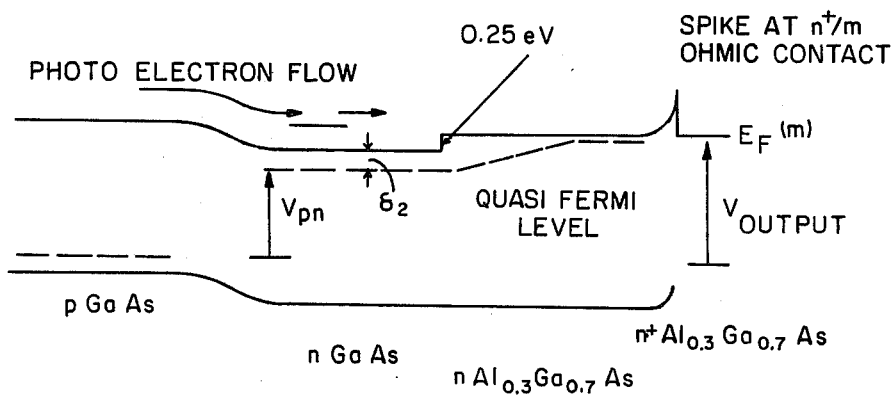

The operation of the embodiment of my invention described above will be more readily understood by reference to FIGS. 2-4, inclusive. In FIG. 2 the lower valley Γ is the primary electron conduction band of the compound at bandgap energy $E_g$. The upper valley X is a secondary electron conduction band of bandgap energy greater than $E_g$ by the amount ΔE, which is 0.36 eV for GaAs. There is another secondary electron conduction band L, at the ordinate axis as plotted, which has a bandgap energy approximately that of upper valley X. The abscissa, as shown, represents carrier momentum and is in the [100] or cube edge direction to the right of the vertical line through the lower valley, and in the [111] or cube diagonal direction to the left of that line.

Consider first the structure of FIG. 1 in which layer 13 has an aluminum content with x about 0.3 and assume that x does not vary with distance. The bandgap of $Al_{0.3}Ga_{0.7}As$ is about 1.75 eV and from FIG. 3 it is still direct gap but near the direct-indirect gap intersection point. The $\Delta E_g$ value of $Al_{0.3}Ga_{0.7}As$ to GaAs is therefore 0.3 eV (1.75 eV−1.45 eV). There may be a $\Delta E_c$ barrier of about 85% of 0.3 eV (i.e. 0.25 eV) in the band diagram according to heterojunction theory. Without illumination, the band diagram for the pGaAs/nGaAs/-n$Al_{0.3}Ga_{0.7}As$ structure has the form shown in FIG. 4a. The doping of the n$Al_{0.3}Ga_{0.7}As$ has been made less than that of the nGaAs so that $\delta_3$ is about 0.25 eV larger than $\delta_2$. This puts the $E_{c3}$ conduction band edges of the $Al_{0.3}Ga_{0.7}As$ about in line or slightly lower in energy than the X and L band valleys of the nGaAs layer shown as $E_{c2}$ in FIG. 4a. The surface orientation of the layers may be [100] or [111] since the X valley in the <100> direction is about as low as the L valley in the <111> direction.

On the application of solar illumination the photons of energy greater than the GaAs bandgap (1.45 eV) are absorbed almost entirely in the pGaAs region of 2-4 μm thickness. The electrons photo-induced by this absorption will appear in all three valley types, Γ, L and X but there will be some tendency to thermalize in a short distance, or time, into the Γ valley since this is the lowest. The tendency for this to occur may be reduced by the doping gradient built-in field in the p region and by partial elimination of low energy photons (hν<1.4 eV) from the solar spectrum by the use of a suitable optical filter, since such photons may, in conjunction with phonons, increase pumping of the L and X electrons into the Γ direct valley. However, many of the photo-induced electrons will be assumed to be in the Γ valley in the pGaAs for the purposes of this explanation.

The Fermi levels $E_{FP}$ and $E_{Fn1}$ separate due to passage of the electrons through the electric field region of the pnGaAs collecting junction. The doping levels in the p and n regions are, however, chosen so that the junction barrier is large enough (even with about 1 V separation of $E_{Fn1}$ and $E_{FP}$) that the $E_{c2}$ upper valleys are about at the same energy level, or slightly below, that of the Γ minimum ($E_{cp}$) in the pGaAs. In passing through the field region of the pn junction electrons may then pick up energy that compensates for scattering energy losses to phonons and so a significant fraction of them finish in the L and X minima valleys of the nGaAs.

These electrons must then be extracted from these valleys before they thermalize into the lower (about 0.35 eV lower) Γ minimum of the nGaAs. This extraction is accomplished by the presence of the n$Al_{0.3}Ga_{0.7}As$ layer. This has its Γ, L and X minima very close together, as may be seen from the intersection of the direct and indirect lines on FIG. 3a. Therefore, electrons from the $E_{c2}$ band of the nGaAs pass into the n$Al_{0.3}Ga_{0.7}As$ and as shown very schematically in FIG. 4c a quasi Fermi level is created as the n$Al_{0.3}Ga_{0.7}As$ is driven more negative in potential and the output voltage of the solar cell is made larger than the voltage $V_{pn}$ across the pnGaAs junction. For clarity and ease of explanation, some simplifications have been made in FIG. 4; in particular the depletion region may extend further into the nGaAs than shown if this region is thin.

As drawn in FIG. 4c, the increment of output voltage is at least 0.25 V and so if $V_{pn}$ is 1.0 V the output voltage in open circuit conditions rises to about 1.25 V. When load current is drawn the load voltage at the maximum power point still remains substantially above that of the conventional pn junction GaAs cell, and so greater output power is obtained and higher efficiency.

Furthermore, the hot electron effect tends to be enhanced at high concentrations of the solar flux. The provision of the nn heterojunction barrier structure therefore tends to improve the performance of such cells under concentrated sun conditions.

Homojunction nn+ structures have been analyzed by Hauser and Dunbar (Solid State Electronics 18, 1975 p. 715). However, no substantial analysis exists of nn heterojunctions under illuminated conditions beyond that reported in Sharma and Purohit, "Semiconductor Heterojunctions" Pergamon 1974.

Fabrication of the structure of FIG. 1 could be by any of the well known methods: liquid-phase epitaxy as described in Milnes and Feucht, Heterojunctions and Metal Semiconductor Junctions, Academic Press, 1972, or by molecular beam epitaxy as described, for example, by Cho and Reinhart in J of Applied Physics, Volume 45, 1974, p. 1812, or by vapor-phase epitaxy from organometallics as described, for example, by Dupuis et al. in the Technical Digest of the 1977 IEEE Int. Electron Devices Meeting, p. 575.

In another method of fabrication of the desired pn$_1$n$_2$ structure the 2-4 μm pGaAs region may be grown with Ge doping (by liquid-phase or vapor-phase methods) on the thin nGaAs region and the p type Ge doping is then supplemented by a later Zn diffusion to enhance the doping gradient that aids the electric field production. The merit of this method is that the thin nGaAs region is not over-compensated by Zn during the growth of the thick p layer (note that Zn is a much faster diffusing impurity than Ge in GaAs).

ADDITIONAL EXAMPLES

Further examples that may be used to illustrate the nature of the invention follow.

EXAMPLE 2

Although the structure in FIG. 1 shows an abrupt step between the nGaAs and the nAl$_{0.3}$Ga$_{0.7}$As, this need not be abrupt but could be a grading of composition over the 1 $\mu$m or so distance involved. This would be easy to achieve with organometallic vapor-phase epitaxy simply by reducing slowly the trimethylaluminum vapor pressure during the growth from nAl$_{0.3}$Ga$_{0.7}$As to nGaAs. This composition grading may even be carried through from the n+Al$_x$Ga$_{1-x}$As to the nGaAs. This would tilt the valence band edge in such a way as to drive holes to the left. This could help reduce recombination of the photo-induced electrons in their passage to the right.

For simplicity in the diagrams FIGS. 4 (a,b,c), the p region has not been shown as containing any built-in field, even though this will be present if the p region is produced by Zn diffusion, or if there is a grading of composition between the pAl$_{0.8}$Ga$_{0.2}$As window and the PGaAs photon absorption region.

EXAMPLE 3

In another example of my invention the layer 11 of FIG. 1 is pIn$_{0.85}$Ga$_{0.15}$P. Layer 12 is an approximately 0.02-1 $\mu$m thick layer of the same material, but n type doped. This is grown on layer 13 which is an n layer of Al$_x$In$_{1-x}$P where x is about 0.15, so that as seen from FIG. 5a there is a lattice match that reduces interface states.

Liquid-phase, molecular beam or vapor-phase epitaxy may be used to fabricate this structure.

EXAMPLE 4

In another example of my invention the layer 11 of FIG. 1 is pGa$_{0.9}$In$_{0.1}$As (bandgap about 1.2 eV from FIG. 5a) and the layer 12 is the same material but n type doped. This is grown by liquid-phase epitaxy, molecular beam epitaxy or vapor-phase epitaxy on layer 13, where this is an n type layer of In$_{0.55}$Ga$_{0.45}$P which has a bandgap of about 1.8 eV from FIG. 5b.

This layer 13 may be grown on a substrate of nGaAs in any several known art methods such as grading or interrupted-step growth to minimize dislocations.

Figure 6:
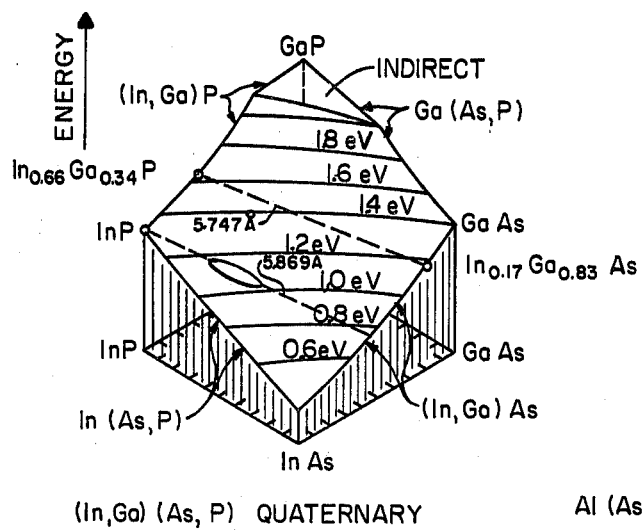
FIGS. 6a and 6b are three-dimensional plots of energy band gap versus composition for quaternary compounds (In,Ga) (As,P) and (Al,Ga) (As,Sb). A few lines of matched lattice constant are also shown.
Figure 6:
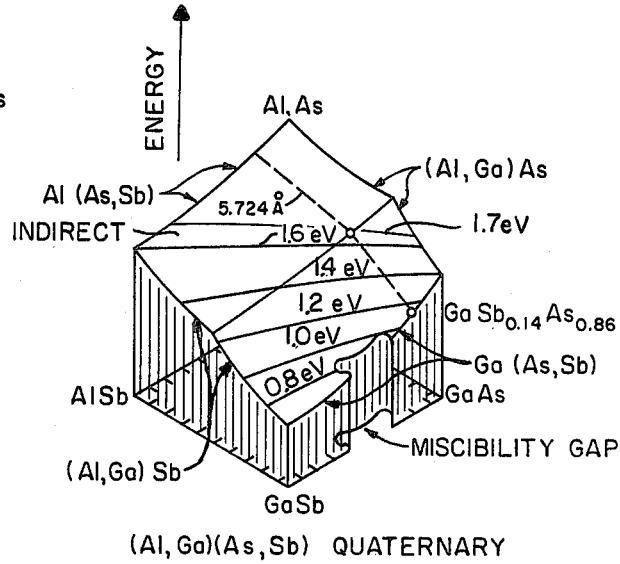
Figure 7:
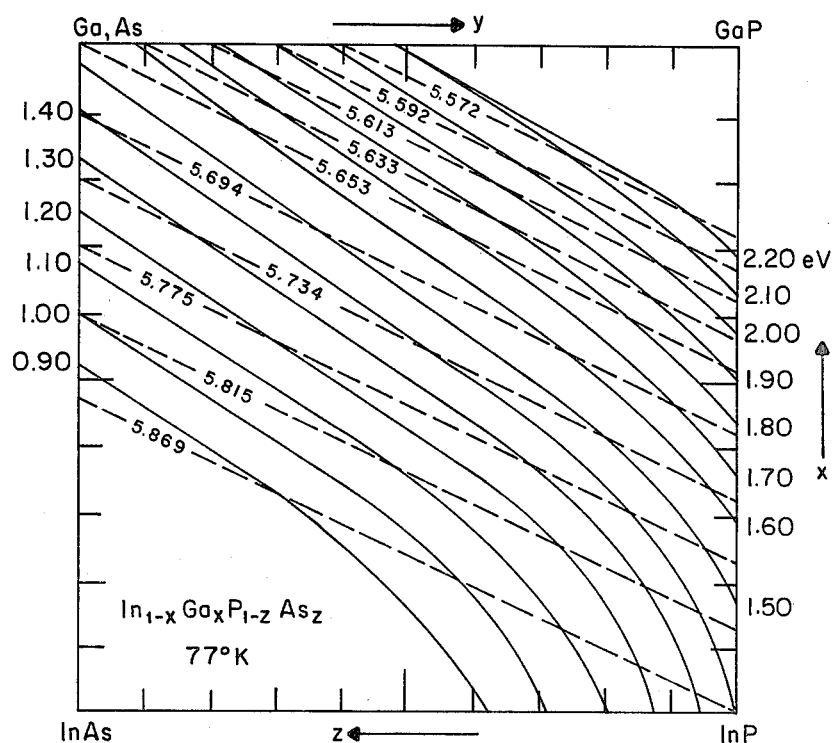
FIG. 7 is a plot of lattice constant and energy gap (77° K.) as a function of composition for the quaternary alloy In$_{1-x}$Ga$_x$P$_{1-z}$As$_2$. The solid lines are constant energy gap curves; the dashed lines are the lattice constant curves.

Some rather similar compositions may be seen from FIG. 6a where the dashed line indicates a lattice constant of 5.747 Å. Other constant lattice parameter conditions may be selected with the aid of FIG. 7.

EXAMPLE 5

Figure 5A:
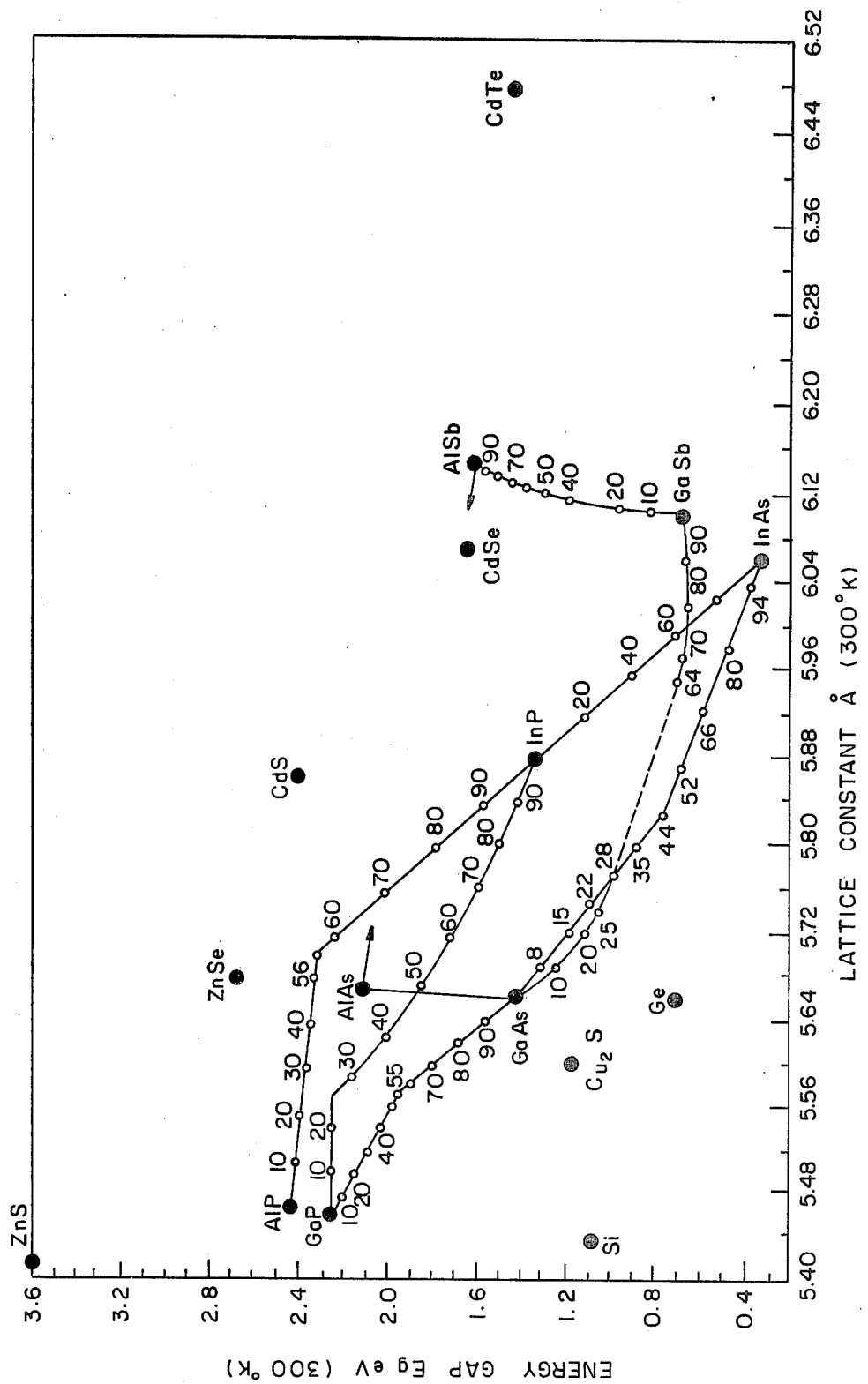
FIG. 5a is a plot of the energy gaps versus lattice constant of various binary and ternary III-V semiconductors.
Figure 5:
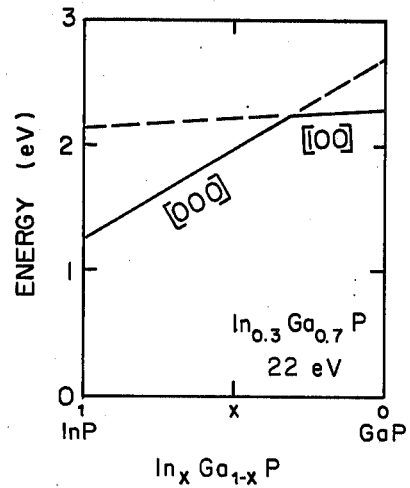
FIG. 5b is a plot of the energy gap versus composition of compounds of InP and GaP.
FIG. 5c is a plot of energy gap versus composition of compounds of GaSb and GaP.
FIG. 5d is a plot of energy gap versus composition for compounds of InAs and AlAs.
FIG. 5e is a plot of energy gap versus composition for compounds of GaAs and GaP.
Figure 5:
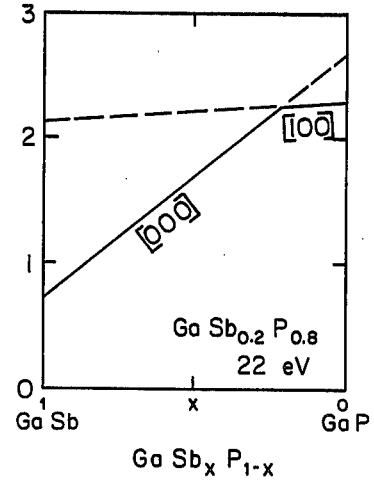
Figure 5:
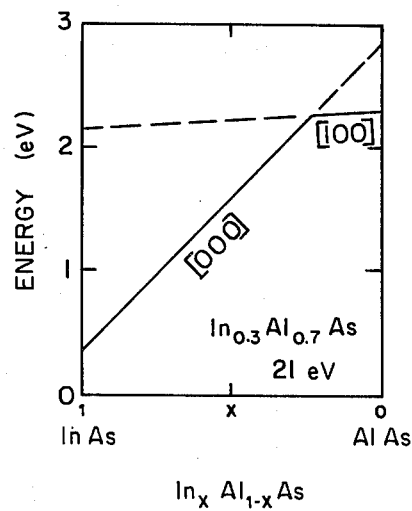
Figure 5:
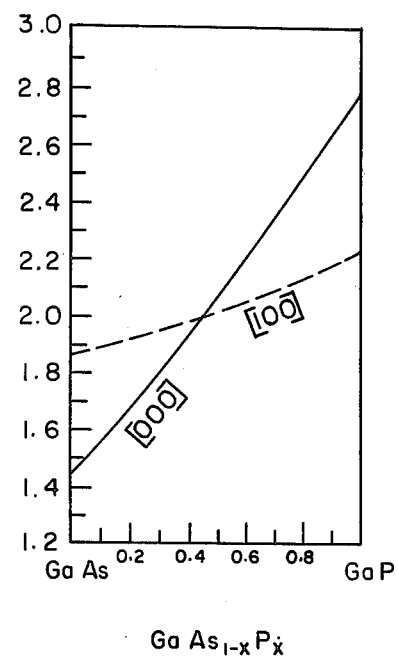

In yet another example of my invention, the layer 11 of FIG. 1 is pGaSb$_{0.14}$As$_{0.86}$ (of bandgap about 1.15 eV from FIG. 5a or FIG. 6b). This is grown on layer 12 which is the same material but n type doped. Layer 12 is grown on the layer 13 which is a quaternary of (Al,Ga) (As,Sb) of bandgap about 1.7 eV and lattice constant 5.724 Å at the indirect-direct bandgap overlap condition as seen in FIG. 6b. The layer 14 may be n+ (AlGa) (AsSb) on an n+GaAs or n+Ge substrate.

Liquid-phase, molecular beam or vapor-phase epitaxy may be used to grow the layers.

EXAMPLE 6

The invention is also applicable to the II-V-V$_2$ semiconductors that are analogs of the III-V compound semiconductors. Such semiconductors are ZnGeAs$_2$ ($E_g$=1.0 eV), CdSnP$_2$($E_g$=1.1 eV), CdSiAs$_2$($E_g$=1.5 eV), ZnSnP$_2$($E_g$=1.6 eV), CdGeP$_2$($E_g$=1.6 eV) and ZnSiAs$_2$($E_g$=1.8 eV). The properties and growth of these semiconductors are described by Shay and Wernick, "Ternary Chalcopyrite Semiconductors: Growth, Electronic Properties and Applications," Pergamon Press 1975. They are also described in the paper by Milnes, "Concepts for Rheotaxially-Grown Thin-Film Tandem III-V Solar Cells," Thirteenth IEEE Photovoltaic Specialists Conference, 1978.

A structure for use of hot electron collection according to the invention is a substrate of n+Ge on which is epitaxially grown by vapor-phase epitaxy a layer of n+ZnSnP$_2$ graded in doping to nZnSnP$_2$; on this is grown nZnGeAs$_2$ about 0.02-1 $\mu$m thick, and on this a pZnGeAs$_2$ collecting region about 4$\mu$ thick. The high energy band electrons are generated at the pn junction and collected from the nZnGeAs$_2$ upper conduction band minima by the heterojunction to the nZnSnP$_2$.

Molecular beam or vapor-phase epitaxy may be used to grow the layers.

EXAMPLE 7

In yet another example of my invention, the structure is a substrate of n+GaP on which has been grown by step-grading a layer of n+In$_{0.4}$Ga$_{0.6}$P, followed by a layer of nIn$_{0.4}$Ga$_{0.6}$P (bandgap 2.0 eV, lattice constant 5.62 Å). On this is grown by vapor-phase epitaxy about a 0.02-1 $\mu$m layer of nGaAs$_{0.8}$P$_{0.2}$ of closely similar lattice constant followed by a 2-4 $\mu$m thick layer of pGaAs$_{0.8}$P$_{0.2}$ (bandgap about 1.64 eV). The advantage of such a structure is that the substrate is transparent to photons of energy (h$\nu$<1.64 eV) that are not used in the cell. Hence, the cell of my invention may be used in a tandem structure in which it is placed in front of a solar cell of lower bandgap such as a pnSi cell so that more electrical power may be extracted from the solar spectrum.

Although the method herein described is particularly suitable for single crystal structures such as pGaAs/nGaAs/nAl$_x$Ga$_{1-x}$As it should be understood that the method is also useful in the fabrication of thin film solar cells of small or medium crystal grain sizes, although not so effective because some losses of hot electrons occur at grain boundaries.

Polycrystalline Pt/nGaAs solar cells have been fabricated by Vohl et al. (IEEE Trans. Electron Devices 1967 Ed-14 p. 26) by H$_2$O transport of GaAs onto metal substrates of Mo. Also, more recently, GaAs thin film growths on low cost substrates by organo-metallic decomposition methods have been reported by Dapkus et al. (13th IEEE Photovoltaic Specialists Conference) and by Blakelee and Vernon (Enhancement of Grain Size in Poly-GaAs Films, 20th Electronic Materials Conference, AIME, Santa Barbara, June 1978). The film structures they use are quite different from those disclosed herein.

In the examples above set out, the sunlight is applied to the opposite side of the cell than the substrate. Another possibility exists if the substrate is transparent. With a glass substrate the sunlight can be applied through the glass, on which is grown, for example, pGaAs, nGaAs and nAl$_y$Ga$_{1-y}$As in that order. The advantage of this structure is that pGaAs may grow with larger grain size on conductive coated glass that does pAl$_x$Ga$_{1-x}$As. Larger grain size may also be encouraged to grow by the application of rheotaxy methods as described by Milnes and Feucht (Conference Record of Twelfth IEEE Photovoltaic Specialists Conference) or by Milnes (in the Thirteenth IEEE Photovoltaic Specialists Conference 1978, and in co-pending U.S. patent application Ser. No. 795,811, now U.S. Pat. No. 4,094,704).

Figure 8:
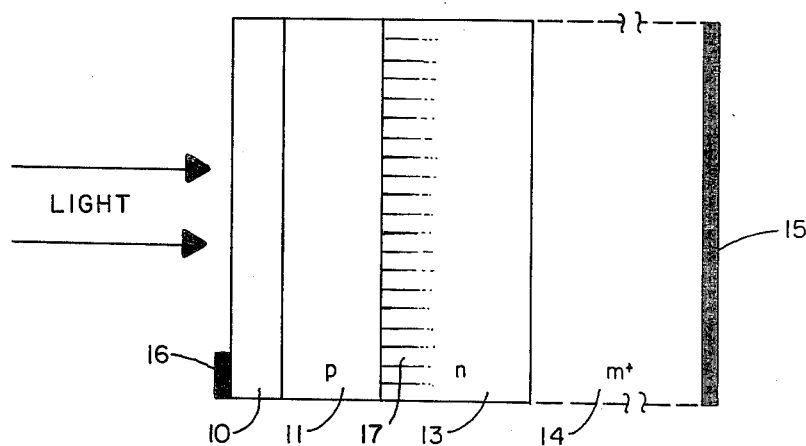
FIG. 8 is a schematic of a modified form of solar cell of my invention.

FIG. 8 illustrates a modified form of invention. It will be seen to be like FIG. 1 in most respects and like reference characters are applied to like elements. The structure of FIG. 8 has no discrete $n_1$ layer, its place being taken by a portion 17 of $n_2$ layer 13 which is graded in composition during deposition toward the composition of p layer 11 over a distance of at least about 200 Å units adjoining p layer 11.

It is, in fact, a $pn_2$ heterojunction structure, the materials and dopings on each side being chosen to achieve band conditions that favor hot electron transfer from the p to the $n_2$ side. In particular, the conduction band edges in the $n_2$ material must be slightly lower in energy than the conduction band edge in the p material under conditions of sun illumination. The materials of the heterojunction must be chosen so that the lattice match is good so that interface state recombination is minimized. An example of such a structure is pGaAs/nAl$_x$Ga$_{1-x}$As, where x is between 0.1 and 0.5 and some grading of material composition has occurred during growth over a distance of 200 Å or so, to minimize the conduction band spike that occurs in perfectly abrupt heterojunctions of this kind.

Basically, $pn_2$ structures are more difficult to fabricate than $pn_1n_2$ structures to obtain the desired output voltage enhancement. A substantial advantage of a $pn_1n_2$ structure such as zinc-doped pGaAs, $n_1$GaAs and $n_2$Al$_{0.3}$Ga$_{0.7}$As is that the $n_1$ region is a partial barrier to zinc entering the Al$_{0.3}$Ga$_{0.7}$As. This is because zinc diffusion in nGaAs is slower than zinc diffusion in nAl$_{0.3}$Ga$_{0.7}$As (see Flat et al., Solid State Electronics 1977, 20, p. 1024). Hence, the presence of the nGaAs region allows a steep transition of doping at the junction and the electric field so created aids the production of hot electrons and so aids the enhancement of the output voltage.

In the foregoing specification I have described presently preferred embodiments of my invention; however, it will be understood that my invention can be otherwise embodied within the scope of the following claims.

I claim:

1. A multiple layer high output solar cell comprising superimposed layers in $pn_1n_2$ form of semiconductor compounds selected from the group consisting of group III-V compound semiconductors and their group II-V-V$_2$ analogs, the $pn_1$ junction being a homojunction of a compound having a primary electron conduction band of minimum bandgap energy and at least one secondary electron conduction band of higher bandgap energy, the p layer being doped so as to create a field therein sufficient to divert "hot" photo-induced electrons from the primary into the secondary electron conduction band of the $n_1$ layer and the $n_2$ layer being adjusted in composition so that its conduction band energy minima are approximately equal to the secondary electron conduction band energy, whereby "hot" electrons in the secondary electron conduction band pass into the $n_2$ layer.

2. The solar cell of claim 1 in which the field strength at the $pn_1$ junction is at least about $10^4$ v/cm.

3. The solar cell of claim 1 in which the $n_1n_2$ junction is a heterojunction.

4. The solar cell of claim 1 in which the $n_2$ layer is a ternary semiconductor compound.

5. The solar cell of claim 1 including a photon window semiconductor layer superimposed on the p layer to reduce the surface recombination of the p layer.

6. The solar cell of claim 1 in which the bandgap energy of the secondary electron conduction band is not more than about 0.5 eV higher than the bandgap energy of the primary electron conduction band.

7. The solar cell of claim 1 in which the $pn_1$ homojunction compound is In$_{0.85}$Ga$_{0.15}$P and the $n_2$ layer is Al$_x$In$_{1-x}$P where x is about 0.15.

8. The solar cell of claim 1 in which the $pn_1$ homojunction compound is Ga$_{0.9}$In$_{0.1}$As and the $n_2$ layer is In$_{0.55}$Ga$_{0.45}$P.

9. The solar cell of claim 1 in which the $pn_1$ homojunction compound is GaSb$_{0.14}$As$_{0.86}$ and the $n_2$ layer is (AlGa)(AsSb) of bandgap about 1.7 eV and lattice constant about 5.724 Å at the indirect-direct bandgap overlap.

10. The solar cell of claim 1 in which the $pn_1$ homojunction compound is ZnGeAs$_2$ and the $n_2$ layer is ZnSnP$_2$ graded in doping from n+ZnSnP$_2$ to nZnSnP$_2$ at its interface with the $n_1$ layer.

11. The solar cell of claim 1 having a substrate of single crystal n+GaAs.

12. The solar cell of claim 1 having a substrate of single crystal n+Ge.

13. The solar cell of claim 1 in which the $pn_1$ homojunction compound is GaAs.

14. The solar cell of claim 13 in which the p layer is zinc doped GaAs.

15. The solar cell of claim 13 in which the $n_2$ layer is Al$_x$Ga$_{1-x}$As where x is between 0.1 and 0.5.

16. The solar cell of claim 1 in which the $pn_1$ homojunction compound is GaAs$_{0.8}$P$_{0.2}$ and the $n_2$ layer is nIn$_{0.4}$Ga$_{0.6}$P at the $n_1$ interface, step graded to n+In$_{0.4}$Ga$_{0.6}$P.

17. The solar cell of claim 16 having a substrate of n+GaP.

18. The solar cell of claim 1 in which the $n_1$ and $n_2$ layers comprise a body of $n_2$ composition graded toward $n_1$ composition over a distance of about at least 200 Å adjacent the p layer, the $n_2$ layer being adjusted in composition so that its bandgap energy is slightly less than the secondary electron conduction band bandgap energy and its lattice constant substantially matches that of the p layer, whereby "hot" electrons in the secondary electron conduction band pass into the $n_2$ layer.

19. The solar cell of claim 18 in which the p layer is GaAs and the $n_2$ layer is Al$_x$Ga$_{1-x}$As where x is between 0.1 and 0.5.

* * * * *

UNITED STATES PATENT AND TRADEMARK OFFICE
CERTIFICATE OF CORRECTION

PATENT NO. : 4,158,577
DATED : June 19, 1979
INVENTOR(S) : Arthur G. Milnes

It is certified that error appears in the above-identified patent and that said Letters Patent are hereby corrected as shown below:

In the Abstract, line 7, "th" should read --the--.

Column 1, line 4, --relates-- should be inserted after "invention".

Column 2, line 7, the comma (,) after "electron" should be deleted.

Column 2, line 28, "As$_2$" should read --As$_z$--.

Column 5, line 27, "PGaAs" should read --pGaAs--.

Signed and Sealed this

Second Day of October 1979

[SEAL]

Attest:

RUTH C. MASON
*Attesting Officer*

LUTRELLE F. PARKER
*Acting Commissioner of Patents and Trademarks*